United States Patent
Pang

(10) Patent No.: US 12,501,555 B2
(45) Date of Patent: Dec. 16, 2025

(54) PROCESS METHOD FOR LASER REMOVAL OF SUBSTRATE SOLDER MASK

(71) Applicants: Trillion Harvest Limited, The Valley (AI); Pei-Chung Pang, Taoyuan (TW)

(72) Inventor: Pei-Chung Pang, Taoyuan (TW)

(73) Assignees: Trillion Harvest Limited (AI); Pei-Chung Pang, Taoyuan (TW)

( * ) Notice: Subject to any disclaimer, the term of this patent is extended or adjusted under 35 U.S.C. 154(b) by 408 days.

(21) Appl. No.: 18/076,914

(22) Filed: Dec. 7, 2022

(65) Prior Publication Data

US 2024/0196544 A1   Jun. 13, 2024

(51) Int. Cl.
*H05K 3/28* (2006.01)
*G06T 7/00* (2017.01)

(52) U.S. Cl.
CPC .......... *H05K 3/288* (2013.01); *G06T 7/001* (2013.01); *H05K 3/282* (2013.01); *G06T 2207/30141* (2013.01); *H05K 2203/108* (2013.01); *H05K 2203/163* (2013.01); *H05K 2203/166* (2013.01)

(58) Field of Classification Search
CPC .. H05K 3/288; H05K 3/282; H05K 2203/108; H05K 2203/163; H05K 2203/166; H05K 3/3452; G06T 7/001; G06T 2207/30141; B23K 2101/42; B23K 26/032; B23K 26/0622; B23K 26/362; B23K 26/40; B23K 31/125

See application file for complete search history.

(56) References Cited

U.S. PATENT DOCUMENTS

2023/0253227 A1* 8/2023 Kang ............... H02J 50/12
414/222.01

FOREIGN PATENT DOCUMENTS

CN      113702290 A   *  11/2021  ............. H05K 3/288

OTHER PUBLICATIONS

P. Mengel, "Automated inspection of solder joints on PC boards by supplementary processing of 3D and gray-level images," [ Proceedings] IECON '90: 16th Annual Conference of IEEE Industrial Electronics Society, Pacific Grove, CA, USA, 1990, pp. 786-791 vol. 1, doi: 10.1109/IECON.1990.149240. (Year: 1990).*

* cited by examiner

*Primary Examiner* — Stephen R Koziol
*Assistant Examiner* — Dylan J Sherrillo

(57) ABSTRACT

A process method for laser removal of substrate solder mask by: providing a substrate with solder pads; covering the substrate and the solder pads with a solder mask, where the part of the solder mask facing the substrate is the shielding part and the part of the solder mask facing the solder pads is the clearing part; using a camera module to read the QR-code for plate production part number on the substrate; automatically importing the CAD/CAM data to the laser device, where the CAD/CAM data corresponds to the plate production part number; sequentially stripping the cleaning part through the laser beam according to the CAD/CAM data to make the solder mask form a hollow portion; taking a picture of the substrate and taking out the processed substrate picture; completing the substrate processing job if the processed substrate picture and the CAD/CAM data are the same.

9 Claims, 7 Drawing Sheets

PROCESS METHOD FOR LASER REMOVAL OF SUBSTRATE SOLDER MASK

BACKGROUND OF THE INVENTION

1. Field of the Invention

The present invention relates to a method of manufacturing a substrate, and more particularly, to a method of manufacturing a substrate, especially a solder mask laser manufacturing method that processes the entire substrate through laser.

2. Description of the Related Art

The solder mask process of the general circuit substrate is usually to apply photosensitive solder mask resist on the surface of the circuit substrate to form a solder mask after the printed circuit is set up, then to pre-cure the solder mask until semi-cured, then to use the photomask to perform exposure and development technology, so that the solder mask is cured against the part of the circuit other than the solder pads, and then to remove the uncured part of the solder mask, so that the solder pads expose the solder mask. Due to the necessary error caused by exposure energy and development, the accuracy is limited, and the pitch of the solder pads cannot be reduced. In addition, direct imaging technology is introduced. Although the cost of the mask is reduced, the equipment cost is extremely high, and the technology is also facing the same problem.

However, the circuit substrate and the photomask will be affected by environmental conditions such as temperature and humidity in the exposure part of the exposure device, which will cause changes in the positional accuracy of the positioning marks on the circuit substrate and the photomask and the positional accuracy of the exposure pattern, resulting in a problem that high-precision patterns cannot be formed, so that the solder pads cannot correctly expose the solder mask. Furthermore, for circuit substrates with different solder pad positions, a mask conforming to the circuit substrate must be produced first, which increases the production cost of the circuit substrate. In addition, the solder mask process of the general circuit substrate often requires the use of different inks, which makes the ink cost high. Moreover, the semi-cured solder mask has insufficient hardness or is sticky, which is easy to cause scrap during operation.

SUMMARY OF THE INVENTION

The present invention provides a process method for laser removal of substrate solder mask, which processes a substrate through a laser with controllable energy. The process method for laser removal of substrate solder mask includes the steps of: providing a substrate and arranging solder pads on the surface of the substrate; covering the surface of the substrate and the solder pads with a solder mask, where the part of the solder mask facing the surface of the substrate is the shielding part and the part of the solder mask facing the solder pads is the clearing part; using a camera module to read the QR-Code for plate production part number on the substrate; automatically importing the CAD/CAM data to the laser device, where the CAD/CAM data corresponds to the plate production part number; sequentially stripping the cleaning part through a laser beam according to the CAD/CAM data; making the solder mask form a hollow portion; taking a picture of the substrate through the camera module and taking out the processed substrate picture; comparing and judging whether the processed substrate picture and the CAD/CAM data are the same; completing the substrate processing job if they are the same.

In one embodiment of the present invention, in the step of comparing and judging whether the processed substrate picture is the same as the CAD/CAM data, if they are not the same, then the laser beam is used to perform the stripping operation on the clearing part for the difference.

In one embodiment of the present invention, in step S104, according to a preset rule, the QR-Code of the production process code of each unit is generated and burned into the designated position of each unit at the same time when construction starts.

In one embodiment of the present invention, the data of the solder mask is imported into the CAD/CAM data, and the data of the solder mask is converted into a positive image, a negative image or a graphic to obtain a construction graphic.

In one embodiment of the present invention, after obtaining the construction graphic, calculate the overlapping area of the laser spots according to the laser spot size and energy of the laser device, and then translate a laser dot matrix.

In one embodiment of the present invention, the substrate is divided into multiple areas to be processed through the CAD/CAM data, and then the laser beam is used to remove the clearing part of each of the areas to be processed according to a preset rule.

In one embodiment of the present invention, the laser light emitted by the laser beam is a high-frequency laser beam above the millisecond level (milliseconds, microseconds, nanoseconds or picoseconds).

In one embodiment of the present invention, the type of the laser beam is selectively to be CO2, Yag or green laser according to the characteristics of the material to achieve the effect of removing solder mask without residue or carbonization.

In one embodiment of the present invention, the laser beam is emitted by multiple laser light sources, which respectively perform stripping operations on the clearing part in sequence according to the CAD/CAM data, and each laser light source is responsible for a different area.

In summary, the process method for laser removal of substrate solder mask disclosed in the present invention can achieve the following effects:

1. Significantly shorten the steps of the processing process.
2. Improve process yield.
3. Laser beam with controllable energy.
4. Improve the pattern accuracy of the processing process.
5. For circuit substrates with different solder pad positions, it is no longer necessary to make a mask that matches the circuit substrate first.
6. It will not be affected by environmental conditions such as temperature and humidity.
7. No development is required to greatly reduce wastewater pollution and save energy at the same time.
8. Unlimited ink, ink cost reduction.
9. Use CO2, Yag or green laser to achieve the effect of removing solder mask without residue or carbonization.
10. Solve the problem in the previous technology that the semi-cured anti-soldering hardness is insufficient or sticky, which is easy to cause scrapping during operation.
11. Reduce environmental damage, comply with ESG standards, and contribute to sustainable development.

The specific examples are described in detail below, and it will be easier to understand the purpose, technical content, characteristics and effects of the present invention.

DETAILED DESCRIPTION OF THE PREFERRED EMBODIMENT

In order to solve many problems in the solder mask process of the existing circuit substrate, the inventor has done many years of research and development to improve the criticism of the existing products. The following will introduce in detail how the present invention uses a process method for laser removal of substrate solder mask to achieve the most efficient functional demands.

Figure 1:
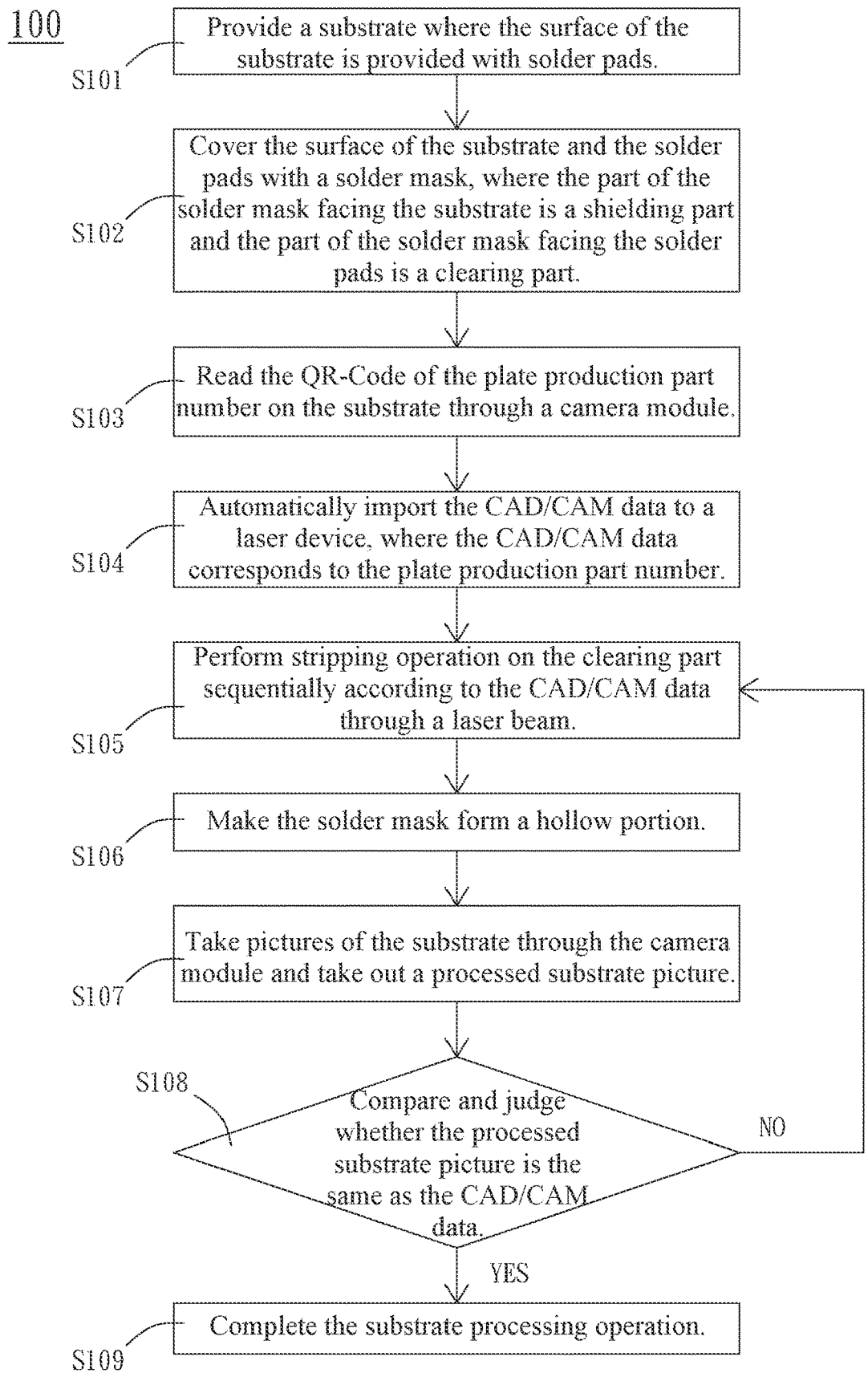
FIG. 1 is a flow chart of the process method for laser removal of substrate solder mask of the present invention.

Please refer to FIG. 1, which is a flow chart of the solder mask laser manufacturing method of the present invention. As shown in FIG. 1, the process method for laser removal of substrate solder mask is to process all or part of a substrate through a laser with controllable energy, rather than just manually using a laser to perform circuit substrate local or single-point optimization. In the embodiment of the present invention, the process method for laser removal of substrate solder mask is mainly used to replace the complicated process of the previous technology and reduce environmental pollution, which meets the ESG standard. ESG is the abbreviation of environmental protection (E, Environmental), social responsibility (S, Social) and corporate governance (G, governance). The process method for laser removal of substrate solder mask 100 includes the following steps: Provide a substrate and arrange solder pads on the surface of the substrate (Step S101). Cover the surface of the substrate and the solder pads with a solder mask, where the part of the solder mask facing the surface of the substrate is defined as a shielding part and the part of the solder mask facing the solder pads is defined as a clearing part (Step S102). Use a camera module to read the QR-Code for plate production part number on the substrate (Step S103). Automatically import the CAD/CAM data to a laser device, where the CAD/CAM data corresponds to the plate production part number (Step S104). Sequentially strip the cleaning part through the laser beam according to the CAD/CAM data (Step S105). Make the solder mask form at least a hollow portion (Step S106). Take a picture of the substrate through the camera module and take out the processed substrate picture (Step S107). Compare and judge whether the processed substrate picture and the CAD/CAM data are the same (Step S108). Complete the substrate processing job if they are the same (Step S109). If it is judged that the processed substrate picture is different from the CAD/CAM data, then the laser beam will perform a stripping operation on the clearing part for the difference, that is, return to Step S105.

Figure 2:
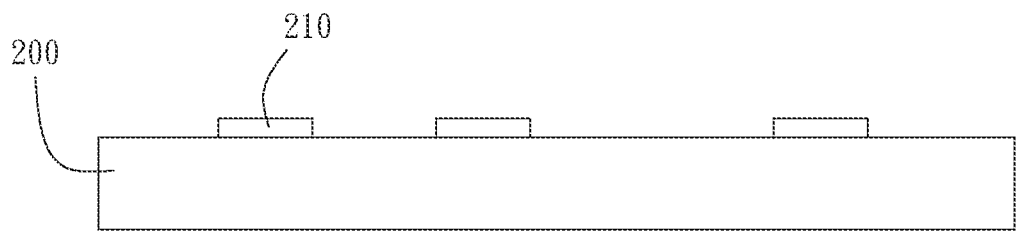
FIG. 2 is a side view of the substrate of the present invention.
Figure 3:
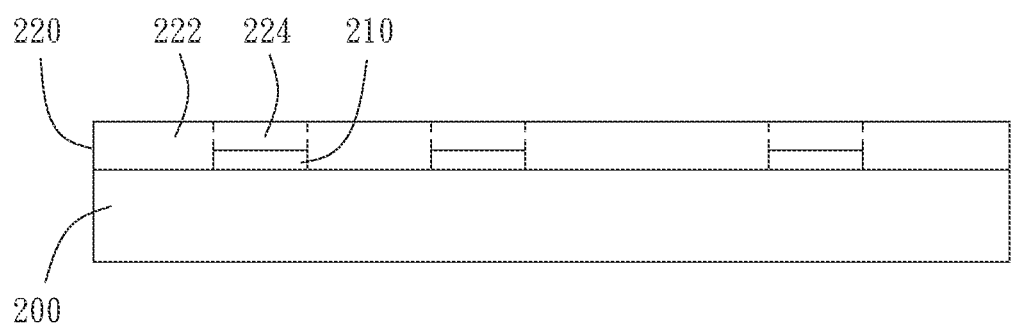
FIG. 3 is a side view of the substrate covered with the solder mask of the present invention.
Figure 4:
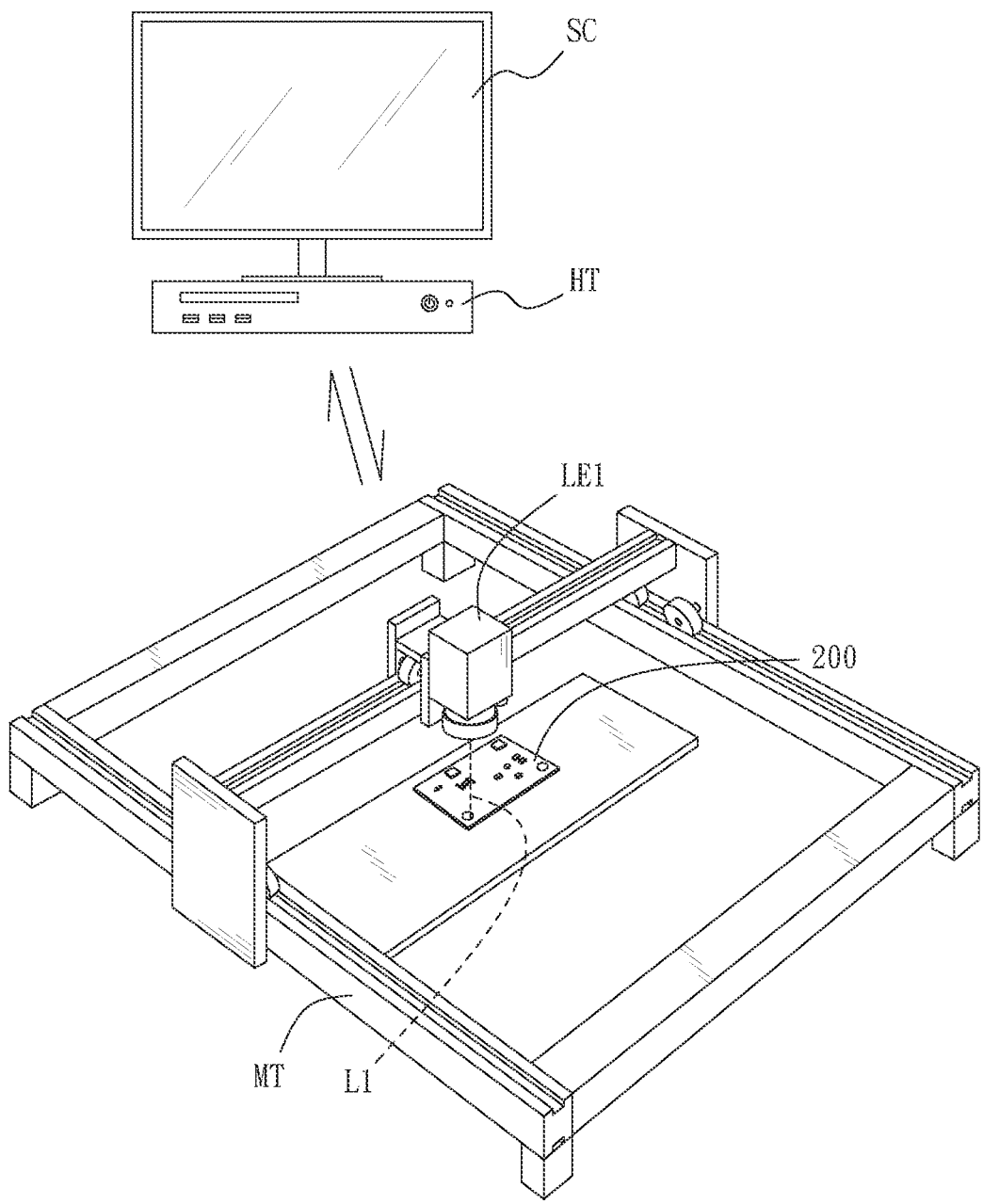
FIG. 4 is a three-dimensional schematic diagram of the laser light processing the substrate of the present invention.
Figure 5:
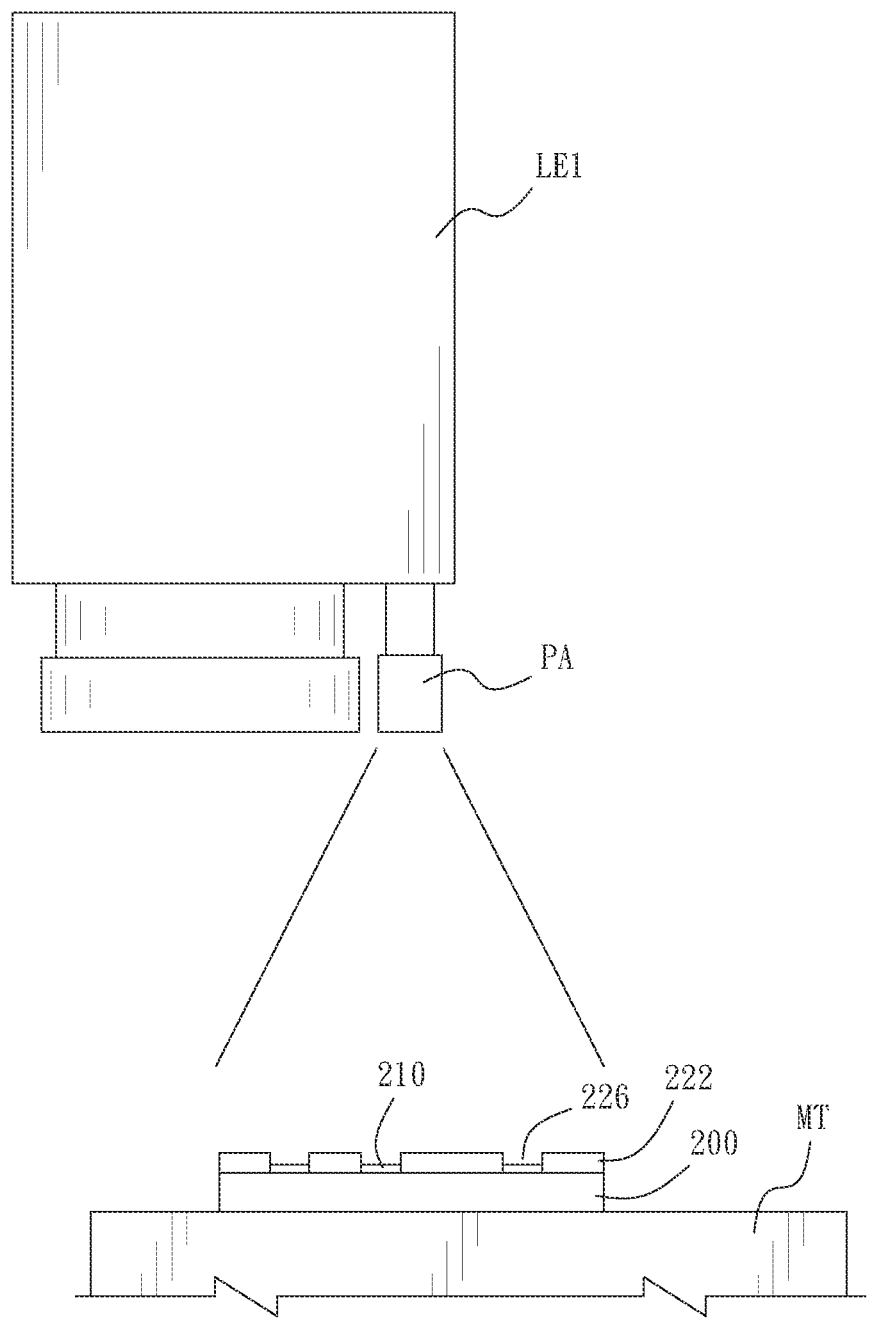
FIG. 5 is a side view of the substrate processed by the laser light of the present invention.
Figure 6:
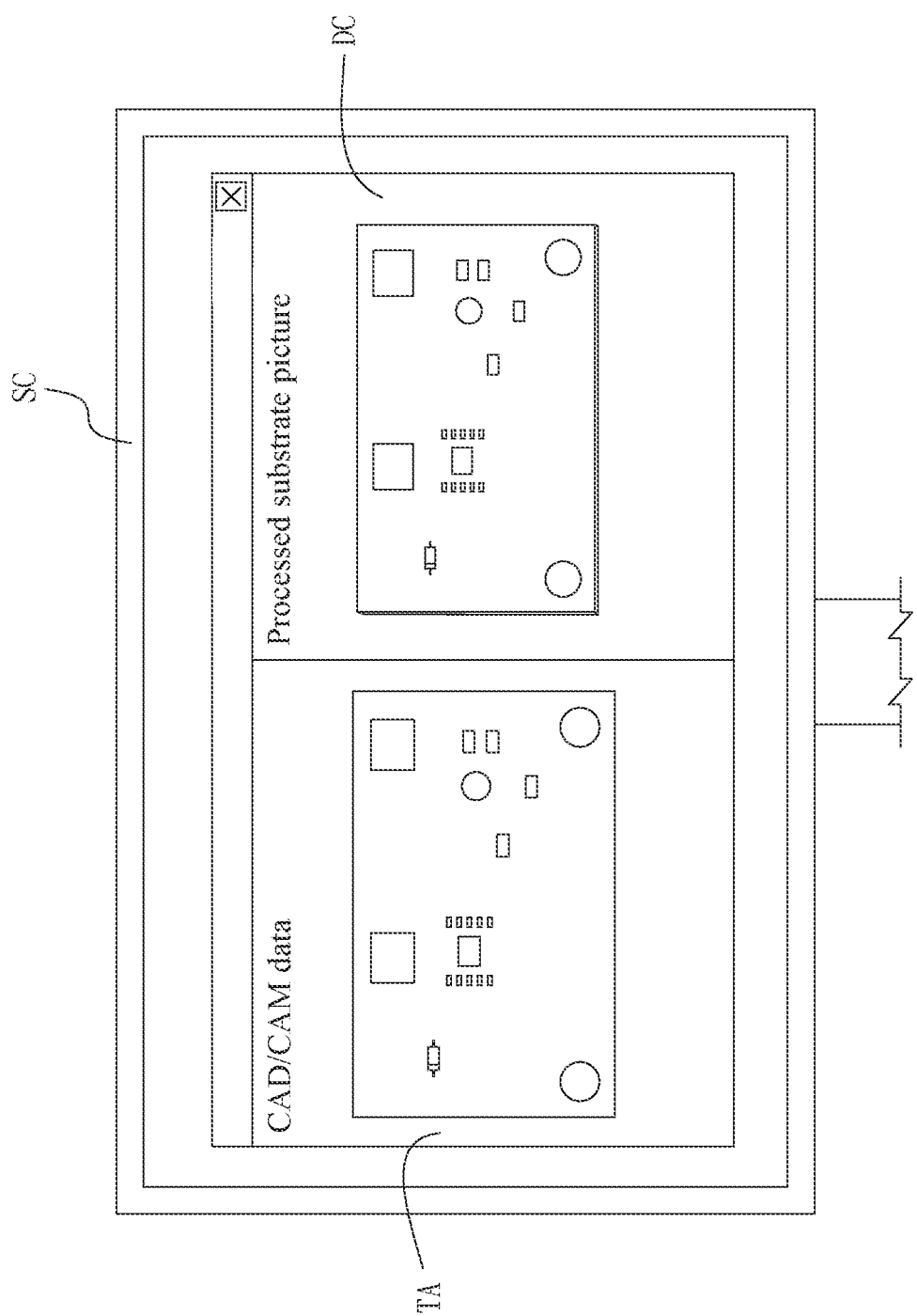
FIG. 6 is a schematic diagram of comparing the CAD/CAM data and the processed substrate picture in the present invention.
Figure 7:
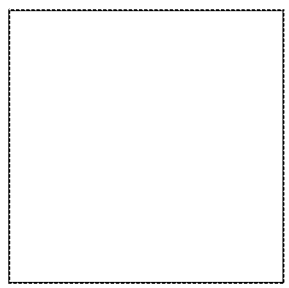
FIG. 7 is a schematic diagram of the translated laser dot matrix of the present invention.
Figure 7:
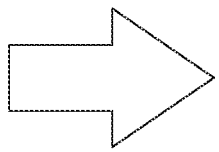
Figure 7:
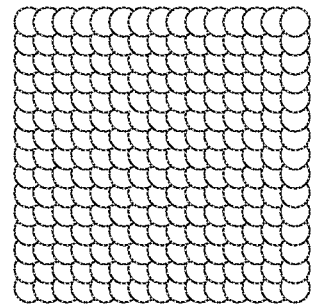
Figure 7:
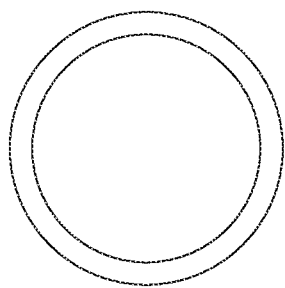
Figure 7:
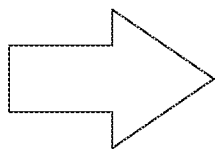
Figure 7:
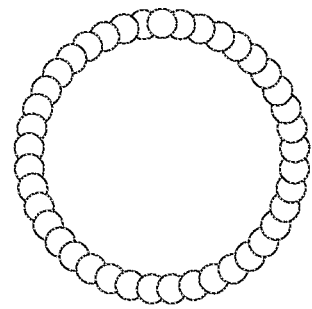
Figure 7:
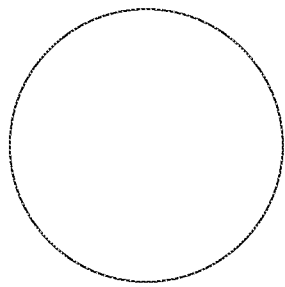
Figure 7:
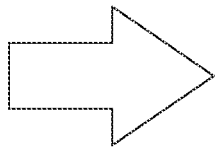
Figure 7:
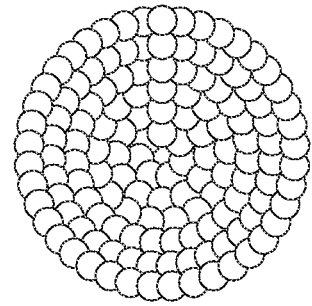

The process method for laser removal of substrate solder mask will be further described in detail below. Please refer to FIGS. 1-7 at the same time, where FIG. 2 is a side view of the substrate of the present invention, FIG. 3 is a side view of the substrate covered with the solder mask of the present invention, FIG. 4 is a three-dimensional schematic diagram of the laser light processing the substrate of the present invention, FIG. 5 is a side view of the substrate processed by the laser light of the present invention, FIG. 6 is a schematic diagram of comparing the CAD/CAM data and the processed substrate picture in the present invention, and FIG. 7 is a schematic diagram of the translated laser dot matrix of the present invention. As shown in the drawings, when performing the process method for laser removal of substrate solder mask 100, in step S101, a substrate 200 is provided with solder pads 210 on its surface (as shown in FIG. 2). In step S102, the surface of the substrate 200 and the solder pads 210 is covered with a solder mask 220, wherein the part of the solder mask 220 facing the surface of the substrate 200 is a shielding part 222, and the part of the solder mask 220 facing the solder pads 210 is a clearing part 224, as shown in FIG. 3. That is to say, at this time, the surface of the circuit substrate is covered with green paint, and then part of the green paint needs to be ablated or stripped. After that, as shown in FIG. 4, the substrate 200 will be fixed on the laser processing machine MT, and the initial positioning will be completed through the CCD on the laser processing machine MT. Next, in step S103, the QR-Code of the plate production part number on the substrate 200 will be read through a camera module. In step S104, the CAD/CAM data TA is automatically imported to a laser device LE1, wherein the CAD/CAM data TA corresponds to the plate production part number. At the same time, in step S104, according to a preset rule, the QR-Code of the production process code of each unit is generated and burned into the designated position of each unit at the same time when construction starts. The above CAD/CAM data TA refers to the output through computer-aided design (CAD)/computer-aided manufacturing system (CAM), which is a graphic-oriented automation system for automatic design, draft, and display. It is worth noting that, in the embodiment of the present invention, during the translation process, the data of the solder mask 220 will be imported to the CAD/CAM data TA, which is to convert the data of the solder mask 220 into positive images, negative images or graphics to obtain construction graphics. After obtaining the construction graphic, calculate the overlapping area of the laser spot according to the size and energy of the laser spot of the laser device, and then translate a laser dot matrix, as shown in FIG. 7. In FIG. 7, it is illustrated by the translation of three kinds of graphics, and the resolution of the laser dot matrix can be set by the designer or the operator. Next, the laser device LE1 on the laser processing machine MT in steps S105 and S106 will be connected to the host HT, and the clearing part 224 on the substrate 200 will be ablated or stripped in sequence according to the CAD/CAM data TA. That is to say, through the X-axis and Y-axis movement mechanisms, the laser device LE1 can emit a laser beam L1 with controllable energy to the substrate 200 according to the CAD/CAM data TA to ablate or peel off the clearing part 224, making the solder mask 220 forms at least one hollow portion 226. It should be noted that the host HT and the laser device LE1 will divide the substrate 200 into multiple areas to be processed through the CAD/CAM data TA, and then the laser beam L1 will ablate or strip the clearing part 224 of each area to be processed according to a preset rule. It will not proceed to the next step S170 until the whole process is run. The laser light emitted by the laser beam L1 is a high-frequency laser beam above the millisecond level (milliseconds, microseconds, nanoseconds or picoseconds). The type of laser beam can be CO2, Yag or green laser according to the characteristics of the material to achieve the effect of removing solder mask without residue or carbonization. In the embodiment of the present invention, for example, the laser beam L1 is a picosecond laser beam, and the picosecond laser beam stays on the substrate 200 for a very short time, that is, it will not excessively ablate or strip off the solder pads 210 under the solder mask 220. Next, in step S107, as shown in FIG. 5, the laser device LE1 will take pictures of the substrate 200 through the camera module PA and take out the processed substrate picture DC. The number of camera module PA is not limited to one. The camera module PA can take pictures of one unit or processed area of the substrate 200 and take out the pictures, and can also take pictures of the whole substrate 200 and take out the pictures. This will be done according to preset rule. Next, in step S108, as shown in FIG. 6, the host HT will use advanced image recognition technology and algorithms to compare and judge whether the processed substrate picture DC and the CAD/CAM data TA are the same. On the screen SC in FIG. 6, you can see that the processed substrate picture DC is being compared with the CAD/CAM data TA. In another embodiment, the host HT can improve the quality of image recognition and the accuracy of comparison with the help of artificial intelligence (AI). Next, if the comparison result between the processed substrate picture DC and the CAD/CAM data TA is the same, the substrate processing operation will be completed. If the comparison result between the processed substrate picture DC and the CAD/CAM data TA is not the same, it will return to step S105, and the laser beam L1 emitted by laser device LE1 will ablate or strip the clearing part 224 on the substrate 200 for the difference. Accordingly, since the process method for laser removal of substrate solder mask 100 of the present invention does not use a photomask at all, for the circuit substrate 200 with different positions of the solder pads 210, it is no longer necessary to make a mask that conforms to the circuit substrate. In addition, the process method for laser removal of substrate solder mask 100 does not use the exposure device at all, so it will not be affected by environmental conditions such as temperature and humidity in the exposure part of the exposure device, so it will not affect the positioning of the circuit substrate and the mask. Therefore, it will not change the position accuracy of the positioning marks on the circuit substrate and the mask, and the position accuracy of the exposure pattern.

Figure 8:
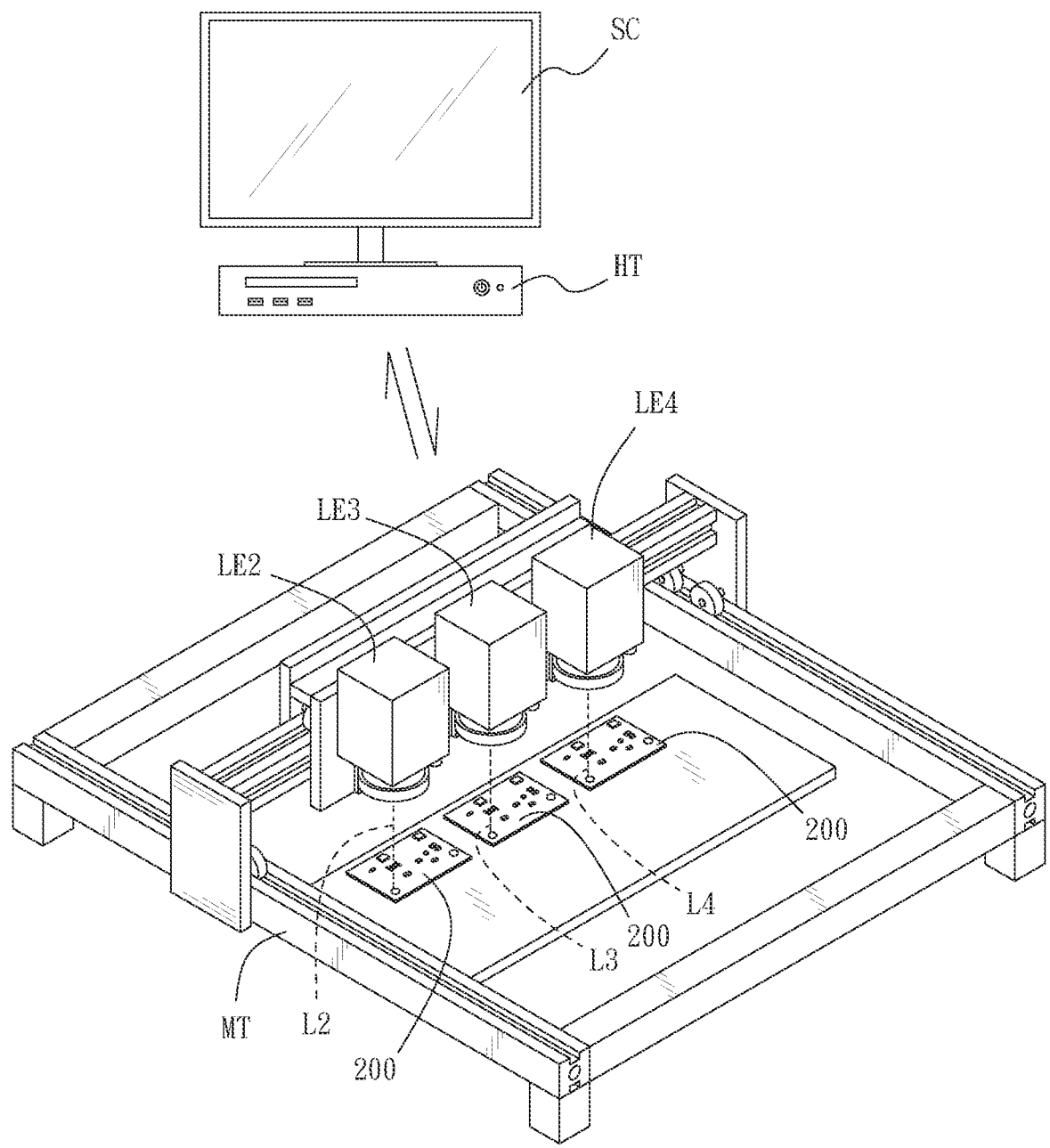
FIG. 8 is a schematic diagram of the multi-source laser processing the substrate of the present invention.

Finally, please refer to FIG. 8, which is a schematic diagram of a multi-source laser processing the substrate of the present invention. There are multiple laser devices LE2, LE3 and LE4 on the laser processing machine MT, which are respectively connected to the host HT for multi-tasking. In addition, the multiple laser devices LE2, LE3 and LE4 respectively emit laser beams L2, L3 and L4 according to the CAD/CAM data TA and perform ablation or stripping operations on the clearing part 224 on the substrate 200 in sequence. The area responsible for the laser light source of each laser device is different, which helps to further improve the efficiency of the processing process. In this embodiment, three laser devices LE2, LE3 and LE4 are used as examples for illustration, but in practical applications, the number of three is not limited. The laser beams L2, L3 and L4 can be high-frequency laser beams above the millisecond level (milliseconds, microseconds, nanoseconds or picoseconds).

In summary, the process method for laser removal of substrate solder mask disclosed in the present invention can achieve the following effects:

1. Significantly shorten the steps of the processing process.
2. Improve process yield.
3. Laser beam with controllable energy.
4. Improve the pattern accuracy of the processing process.
5. For circuit substrates with different solder pad positions, it is no longer necessary to make a mask that matches the circuit substrate first.
6. It will not be affected by environmental conditions such as temperature and humidity.
7. No development is required to greatly reduce wastewater pollution and save energy at the same time.
8. Unlimited ink, ink cost reduction.
9. Use CO2, Yag or green laser to achieve the effect of removing solder mask without residue or carbonization.
10. Solve the problem in the previous technology that the semi-cured anti-soldering hardness is insufficient or sticky, which is easy to cause scrapping during operation.
11. Reduce environmental damage, comply with ESG standards, and contribute to sustainable development.

What the invention claimed is:

1. A method for laser removal of a substrate solder mask, the method comprising steps of:
   providing a substrate where a surface of said substrate comprises solder pads;
   covering the surface of said substrate and said solder pads with a solder mask, wherein a portion of said solder mask facing the surface of said substrate is a shielding portion and a portion of said solder mask facing said solder pads is a clearing portion;
   reading a QR-Code of a plate production part number on said substrate using at least one camera module;
   automatically importing CAD/CAM data to a laser device, said CAD/CAM data corresponding to said plate production part number;
   performing a stripping operation on said clearing portion according to said CAD/CAM data using a laser beam to cause
   said solder mask to comprise at least one hollow portion in said clearing portion according to said CAD/CAM data;
   taking at least a picture of said substrate through said at least one camera module to obtain a processed substrate picture; and
   comparing said processed substrate picture to said CAD/CAM data
   to determine if processing of said substrate is complete.

2. The method of claim 1, wherein in the step of comparing said processed substrate picture to said CAD/CAM data, if comparison of said processed substrate picture and said CAD/CAM data indicates presence of remaining solder mask in the clearing portion, the method further comprising using said laser beam to perform a stripping operation on the clearing portion to remove the remaining solder mask.

3. The method of claim 1, further comprising, according to a preset rule, generating a QR-Code of a production process code of each substrate and burning the QR-Code into a designated position of each substrate.

4. The method of claim 1, wherein data of said solder mask is imported into said CAD/CAM data, and the data of said solder mask is converted into a positive image, a negative image or a graphic to obtain a construction graphic.

5. The method of claim 4, wherein after obtaining said construction graphic, calculating an overlapping area of laser spots according to a laser spot size and energy of said laser device to generate a laser dot matrix.

6. The method of claim 1, wherein said substrate is divided into multiple areas to be processed through said CAD/CAM data, and then said laser beam is used to remove the clearing portion of each of the areas to be processed according to a preset rule.

7. The method of claim 1, wherein the laser light emitted by said laser beam is a high-frequency laser beam above the millisecond level.

8. The method of claim 1, wherein a type of said laser beam is CO2, Yag or a green laser according to material characteristics to achieve an effect of removing the solder mask without residue or carbonization.

9. The method of claim 1, wherein said laser beam is emitted by multiple laser light sources, which respectively perform stripping operations on said clearing portions according to said CAD/CAM data, and each said laser light source being responsible for a different area.

* * * * *